US006458472B1

(12) United States Patent
Konarski et al.

(10) Patent No.: US 6,458,472 B1
(45) Date of Patent: Oct. 1, 2002

(54) FLUXING UNDERFILL COMPOSITIONS

(75) Inventors: Mark M. Konarski, Old Saybrook; J. Paul Krug, Middletown, both of CT (US)

(73) Assignee: Henkel Loctite Corporation, Rocky Hill, CT (US)

(*) Notice: Subject to any disclaimer, the term of this patent is extended or adjusted under 35 U.S.C. 154(b) by 88 days.

(21) Appl. No.: 09/755,146

(22) Filed: Jan. 8, 2001

(51) Int. Cl.⁷ ................................................ H01L 29/12
(52) U.S. Cl. .......................... 428/620; 29/848; 29/849; 29/855; 148/25; 228/180.22; 257/738; 257/778; 257/783; 523/455; 528/113
(58) Field of Search .......................... 29/848, 849, 855; 148/25; 228/180.22; 428/620, 626; 523/455; 528/113; 257/738, 778, 783

(56) References Cited

U.S. PATENT DOCUMENTS

| | | | |
|---|---|---|---|
| 4,869,772 A | 9/1989 | McDonnell et al. | 156/314 |
| 5,128,746 A | 7/1992 | Pennisi | 357/72 |
| 5,417,771 A | 5/1995 | Arita et al. | 148/23 |
| 5,985,043 A | 11/1999 | Zhou et al. | 148/24 |
| 6,010,577 A | 1/2000 | Bristol et al. | 148/23 |
| 6,017,634 A | 1/2000 | Capote et al. | 428/414 |
| 6,132,646 A | 10/2000 | Zhou et al. | 252/512 |
| 6,180,696 B1 * | 1/2001 | Wong | 523/457 |

FOREIGN PATENT DOCUMENTS

| | | | |
|---|---|---|---|
| WO | WO 98/37134 | 8/1998 | C09K/3/20 |
| WO | WO 99/54372 | 10/1999 | C08G/59/18 |

OTHER PUBLICATIONS

Lucus, et al., "Trends in Controlling Reactivity in Epoxy Formulations" (1986).

R.P. Prasad, Surface Mount Technology: Principles and Practice, Part Three—Manufacturing with Surface Mounting, International Thomson Publishing, New York, 576–82 (1997).

* cited by examiner

Primary Examiner—Robert Dawson
Assistant Examiner—D. Aylward
(74) Attorney, Agent, or Firm—Steven C. Bauman

(57) ABSTRACT

This invention relates to fluxing underfill compositions useful for fluxing metal surfaces in preparation for providing an electrical connection and sealing the space between semiconductor devices, such as chip size or chip scale packages ("CSPs"), ball grid arrays ("BGAs"), land grid arrays ("LGAs"), flip chip assemblies ("FCs") and the like, each of which having a semiconductor chip, such as large scale integration ("LSI"), or semiconductor chips themselves and a circuit board to which the devices or chips, respectively, are electrically interconnected. The inventive fluxing underfill composition begins to cure at about the same temperature that solder used to establish the electrical interconnection melts.

21 Claims, 4 Drawing Sheets

FLUXING UNDERFILL COMPOSITIONS

BACKGROUND OF THE INVENTION

1. Field of the Invention

This invention relates to fluxing underfill compositions useful for fluxing metal surfaces in preparation for providing an electrical connection and sealing the space between semiconductor devices [such as chip size or chip scale packages ("CSPs"), ball grid arrays ("BGAs"), land grid arrays ("LGAs"), flip chip assemblies ("FCs") and the like, each of which having a semiconductor chip, such as large scale integration ("LSI")], or semiconductor chips themselves, and a circuit board to which the devices or chips, respectively, are electrically interconnected. The inventive fluxing underfill compositions begin to cure at about the same temperature that solder used to establish the electrical interconnection melts.

2. Brief Description of Related Technology

Such CSPs, BGAs and LGAs improve the characteristics of the electronic device with which they are used while serving to protect semiconductor bare chips, such as LSIs. Ordinarily, the CSP/BGA/LGA assembly is electrically interconnected to a circuit board by use of solder. Solder, such as eutectic tin/lead solder (melting point, 183° C.) or lead/indium solder (melting point, 220° C.), are ordinarily used.

Solder serves to provide a contact pad for, for instance, metal terminals on the semiconductor device to join the integrated circuit to the substrate. Such solder bump interconnection technology was developed to eliminate the expense, unreliability, and low productivity of manual wire bonding. This technology has allowed considerable increase in throughput as well as interconnect density as it progressed to full population area arrays, and has vitiated the manufacturing hurdle of assembling the increasingly smaller sized microelectronic devices as we know them today.

However, when the resulting CSP/BGA/LGA circuit board structure is exposed to thermal cycling, the reliability of the solder connection between the circuit board and the CSP/BGA/LGA often becomes suspect. It has become common for the space between the CSP/BGA/LGA assembly and the circuit board to which the assembly is electrically interconnected to be filled with an underfill sealant in order to relieve stresses caused by thermal cycling by more closely matching the differences in coefficients of thermal expansion between the semiconductor device and the substrate, thereby improving heat shock properties and enhancing the reliability of the structure. In addition, an underfill sealant is often used to temper vibrational disturbances and physical stresses that may cause electrical disconnects.

Typically, during the solder electrical interconnection process, flux is placed on the solder, allowing the solder to make a secure electrical interconnection when exposed to elevated temperatures reached during a solder reflow cycle, a typical profile for which is depicted in FIG. 2, curve B. The semiconductor device is then aligned with the substrate and the solder is reflowed under such elevated temperature conditions.

In the past, after the solder reflow cycle, residue from the flux would be removed—in order to prevent semiconductor device corrosion—using organic- or aqueous-based solvents, depending on the nature of the flux. However, the narrow space between the semiconductor device and the substrate, renders flux residue removal difficult and time-consuming, requiring sophisticated and expensive cleaning systems. Many semiconductor device manufacturers would prefer to eliminate this step, provided that no increase of corrosions is introduced.

Accordingly, eliminating the flux residue removal step became an important consideration for semiconductor device manufacturers. And recent commercial interest has led to industry efforts to produce epoxy-based underfill sealants which are capable of fluxing the metalization and designed to cure during the solder reflow cycle.

Efforts in that regard have focused primarily on including the fluxing agent in the underfill sealant, which fluxing agent would probably be a "no-clean" fluxing agent.

In one such disconcerted effort, International Patent Publication No. WO 98/37134 refers to a no-flow underfill encapsulant for flip-chip technology. This encapsulant is based on epoxy resin(s), an anhydride hardener, an accelerator, a surfactant and a fluxing agent, and uses a viscosity-controlling agent, such as fumed silica, and a coupling agent. This encapsulant is reported to provide optimized flow and a curing reaction only after attaining the maximum solder bump reflow temperature of about 190–230° C.

U.S. Pat. No. 5,128,746 (Pennisi) describes a thermally curable adhesive having a fluxing agent for use in reflow soldering an electrical component and a substrate. This adhesive reportedly removes oxide coatings on the metalization of the electrical component, and the adhesive at least partially cures when heated to solder reflow temperatures. The adhesive includes a thermoset resin, a fluxing agent, and a curing agent that reacts with and cures the thermoset resin when the thermally curable adhesive is heated.

To date, epoxy curatives used in commercially available or known epoxy-based compositions ordinarily either require a post-cure heating step to cure the composition in this application, because the curing agents cure slowly, or the epoxy-based compositions are too reactive, and as a result gel prematurely, thereby resulting in electrical disconnects which is the case with compositions described in the '746 patent. While either of these events may not pose problems in some commercial applications, for fluxing underfill applications where self-alignment of a semiconductor device on a carrier substrate is planned to occur, premature gellation frequently causes a misalignment of the semiconductor/device substrate interface. Such misalignment triggers an electrical disconnect, thereby rendering the mounted electronic assembly inoperable. In addition, where the epoxy-based composition cures slowly, many microelectronics assemblers are reluctant to use a post-cure heating step, as such post-cure may raise temperatures to an extent that may compromise the integrity of the mounted electronic assembly as a whole, by destroying one or more semiconductor devices attached to the substrate, and also increases processing time and expense.

An alternative approach would be for microelectronics assemblers to alter the solder reflow profile. Such an alternative solder reflow profile, which has been promoted by certain material suppliers, known as the "volcano profile" (see FIG. 2, curve A), allows solder to reflow quickly in view of the aggressive temperature increase to the solder reflow temperature over a short period of time, without any zoning or staging of the temperature ranges. As a result, the semiconductor components are subjected to thermal shock which oftentimes may also compromise their integrity. While underfill sealants with fluxing capabilities may be developed to satisfy that profile as a practical matter, the volcano profile is believed to find little to no practical use in the assembly of microelectronics components, because it is not compatible with other applications that occur on the substrate. And, those underfill sealants with fluxing capabilities that had been offered for sale in the past are incompatible with the zoned solder reflow profile described above, resulting in microelectronic assemblies that fail to conduct electricity.

International Patent Application No. PCT/GB99/01236 speaks to a thermally curable adhesive composition which includes a crosslinkable thermosetting material and a chemical crosslinking agent having fluxing properties and exhibiting restricted or no thermosetting reactivity with the material without the action of a catalyst and/or heat. The composition is thermally curable when heated to temperature range extending from the liquidus temperature of the alloy Sn/Pb 60/40 up to the liquidus temperature of the alloy Sn/Pb 3/97 and in the presence of a catalyst for the crosslinking of the material with the crosslinking agent. The composition is reported to be storage and reaction stable in the absence of such catalyst and at a temperature in the range of 20–25° C.

In their 1986 commercial literature publication entitled "Trends in Controlling Reactivity in Epoxy Formulations", Lucus, et al., describes generally a balance between reactivity and latency, and the ability to control reactivity (and of course latency) by using an amine salt in a non-aqueous environment, such as an epoxy-based matrix, where the amine salt would disassociate, thereby liberating an amine accelerator. The liberation of this amine accelerator is the rate determining step for reaction.

To date, however, it is not believed that amine salts have been used to prepare adhesive compositions for the assembly of microelectronic devices, where the adhesive cures at the temperature range within which the amine salt disassociates, which is tailored to the temperature range at which solder melts.

Diaza- and triaza-bicyclo compounds have been used in connection with adhesives in the past, such as in adhesion promoting primer compositions for use with cyanoacrylate-containing adhesive compositions. See U.S. Pat. No. 4,869,772 (McDonnell).

Nevertheless, to date, it is not believed that a fluxing underfill sealant as set forth in more detail below has been described or received with commercial acceptance.

Accordingly, it would be desirable to provide a fluxing underfill composition that possesses appropriate cure profiles so as to alleviate the concerns noted above. In addition, it would be desirable to provide such a composition that fluxes the solder while curing, which occurs during the solder reflow cycle.

SUMMARY OF THE INVENTION

The present invention provides a fluxing underfill composition, which includes an epoxy resin component; an acidic fluxing agent component; an anhydride component; and a latent curing agent component. The latent curing agent component includes a complex of a portion of the acidic fluxing agent and a salt of a nitrogen-containing component.

The invention provides a fluxing underfill composition capable of curing within specified portion of the temperature profile reached during a solder reflow cycle. With the acidic fluxing agent being included in the composition, a separate fluxing step is thereby obviated.

Before, after or during application of the composition, a semiconductor device is positioned on the carrier substrate, and solder, which is present on either or both of the semiconductor device and/or carrier substrate, is exposed to temperatures reached during solder reflow cycle conditions. During a specified portion of the temperature profile reached during the solder reflow cycle, the composition is cured, thereby establishing and maintaining an electrical interconnection while encapsulating the semiconductor device onto the substrate. The acidic fluxing agent removes oxides from the substrate surface as the composition cures which at present would likely interfere with the solder and the underfill performance.

An adhesive with fluxing properties can be used to reflow solder and encapsulate surface mounted components, and flip chip integrated circuits in particular, while providing environmental protection of the active surface of the integrated circuit.

Other benefits and advantages of the present invention will become more readily apparent after a reading of the "Detailed Description" section together with the figures.

DETAILED DESCRIPTION OF THE INVENTION

Figure 1:
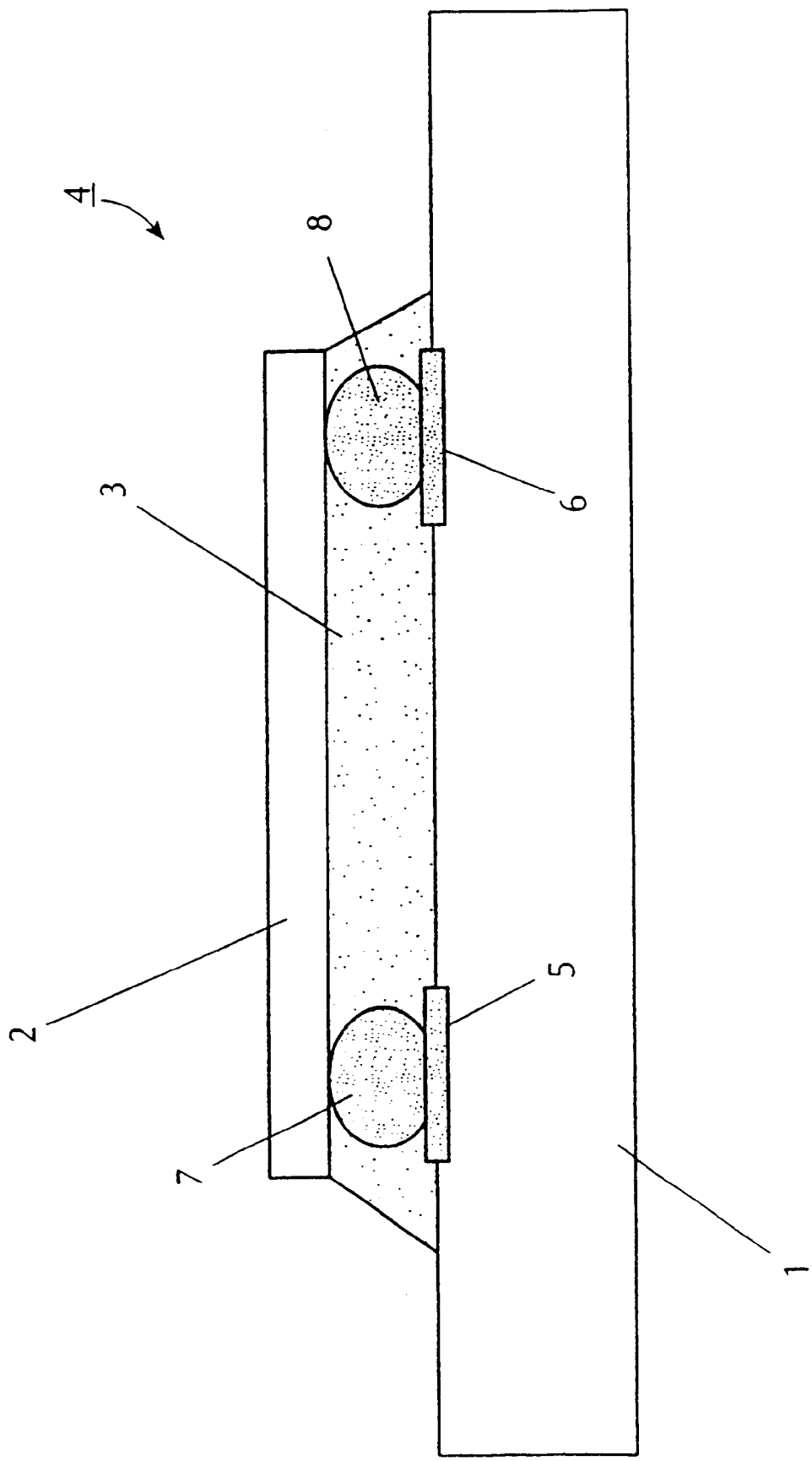
FIG. 1 depicts a cross-sectional view showing an example of the mounting structure in which the fluxing underfill composition of the present invention is used after being reflowed.

As noted above, the present invention provides a fluxing underfill composition, which includes an epoxy resin component; an acidic fluxing agent component; an anhydride component; and a latent curing agent component. The latent curing agent includes a complex of a portion of the acidic fluxing agent and a salt of a nitrogen-containing component.

Typically, the composition includes about 10 to about 70 weight percent of the epoxy resin component by weight of the total composition; about 1 to about 15 weight percent of an acidic fluxing agent; about 15 to about 50, such as about 30 to about 40, weight percent of an anhydride component; and about 3 to about 30 weight percent of the latent curing agent component, of which about 0.1 to about 1.0 weight percent is comprised of the salt of the nitrogen-containing component and an amount of the acidic fluxing agent sufficient to form a complex therewith based on the total weight of the curable resin component, depending of course on the type and identity of the latent curing agent chosen.

Of course, depending on the particular set of physical properties desirable for a composition destined for a specific purpose these values may vary somewhat. Such variation may be achieved without undue experimentation by those persons skilled in the art, and accordingly are contemplated within the scope of the present invention.

The epoxy resin component of the present invention may include any common epoxy resin, such as a multifunctional epoxy resin. Ordinarily, the multifunctional epoxy resin should be included in an amount within the range of about 15 to about 75 weight percent, such as about 40 to about 60 weight percent, based on the weight of the total of the epoxy resin component. In the case of bisphenol-F-type epoxy resin, desirably the amount thereof should be in the range of from about 35 to about 65 weight percent, such as about 40 to about 50 weight percent of the total of the epoxy resin component.

Examples of the multifunctional epoxy resin include bisphenol-A-type epoxy resin (such as RE-310-S from Nippon Kayaku, Japan, or "EPON" 828 or "EPON" 1002f from Shell Chemical Co.), bisphenol-F-type epoxy resin (such as RE-404-S from Nippon Kayaku, Japan), phenol novolac-type epoxy resin, and cresol novolac-type epoxy from resin (such as "ARALDITE" ECN 1871 from Ciba Specialty Chemicals, Hawthorne, N.Y.).

Other suitable epoxy resins include polyepoxy compounds based on aromatic amines and epichlorohydrin, such as N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate.

Among the epoxy resins suitable for use herein also include polyglycidyl derivatives of phenolic compounds, such as those available commercially under the tradename "EPON", such as "EPON" 1031 from Shell Chemical Co.; "DER" 331, "DER" 332, "DER" 334, and "DER" 542 from Dow Chemical Co.; and "BREN-S" from Nippon Kayaku, Japan. Other suitable epoxy resins include polyepoxides prepared from polyols and the like and polyglycidyl derivatives of phenol-formaldehyde novolacs, the latter of which are available commercially under the tradename "DEN", such as "DEN" 431, "DEN" 438, and "DEN" 439 from Dow Chemical. Cresol analogs are also available commercially under the tradename "ARALDITE", such as "ARALDITE" ECN 1235, "ARALDITE" ECN 1273, and "ARALDITE" ECN 1299 from Ciba Specialty Chemicals. SU-8 is believed to be a cresol novolac epoxy available from Interez, Inc. Polyglycidyl adducts of amines, aminoalcohols and polycarboxylic acids are also useful in this invention, commercially available resins of which include "GLYAMINE" 135, "GLYAMINE" 125, and "GLYAMINE" 115 from F.I.C. Corporation; "ARALDITE" MY-720, "ARALDITE" 0500, and "ARALDITE" 0510 from Ciba Specialty Chemicals and PGA-X and PGA-C from the Sherwin-Williams Co. Copolymers of epichlorohydrin and bisphenol A as well, such as "EPON" 1001 and "EPON" 1009 from Shell Chemical Co., may be used.

And of course combinations of the different epoxy resins are also desirable for use herein.

Appropriate acidic fluxing agents for use herein include abietic acid, adipic acid, ascorbic acid, acrylic acid, citric acid, 2-furanoic acid, malic acid, salicylic acid, glutaric acid, pimelic acid, polyacrylic acids, and organic acids, such as phenol and derivatives thereof, and sulfonic acids, such as toluene sulfonic acids.

A particularly desirable one is DIACID 1550 which is a liquid monocyclic twenty one carbon dicarboxylic acid derived from tall oil fatty acids; specifically, it is 5-n-hexyl-2-(carboxy-n-heptyl) cyclohex-3-ene carboxylic acid, available commercially from Westvaco Oleo Chemicals.

The acidic fluxing agent should be included in the inventive compositions in an amount within the range of about 1 to about 15 weight percent.

Appropriate anhydride compounds for use herein include mono- and poly-anhydrides, such as hexahydrophthalic anhydride ("HHPA") and methyl hexahydrophthalic anhydride ("MHHPA") (commercially available from Lindau Chemicals, Inc., Columbia, S.C., used individually or as a combination, which combination is available under the trade designation "LINDRIDE" 62C), 5-(2,5-dioxotetrahydrol)-3-methyl-3-cyclohexene-1,2-dicarboxylic dianhydride (commercially available from ChrisKev Co., Leewood, Kans. under the trade designation B-4400), nadic methyl anhydride, 3,3',4,4'-benzophenone tetracarboxylic dianhydride ("BTDA"), pyromellitic dianhydride ("PMDA"), 3,3', 4,4'-biphenyl tetracarboxylic dianhydride ("s-BPDA"), 2,2'-bis-(3,4-carboxyphenyl) hexafluoropropane dianhydride ("6FDA"), 4,4'-oxydiphthalic anhydride ("ODPA"), 3,3',4,4'-diphenylsulfone tetracarboxylic dianhydride ("DSDA"), ethylene glycol bis (anhydro-trimellitate) ("TMEG-200", "TMEG-100") and combinations thereof.

Of course, combinations of these anhydride compounds are also desirable for use in the compositions of the present invention.

Desirably, the anhydride component should be present in an amount within the range of about 15 to about 50 weight percent, such as about 30 to about 40 weight percent, desirably about 35 weight percent.

The latent curing agent component includes materials capable of catalyzing the polymerization of the epoxy resin component of the inventive compositions once a triggering event occurs, such as a certain temperature is reached. Desirably, the latent curing agents include complexes of the salt of the nitrogen containing compounds and a portion of the acidic fluxing agent.

The nitrogen-containing compound portion of the salt thereof is ordinarily amine compounds, including polyamines and di- and tri-aza compounds, amide compounds, imidazole compounds, and combinations thereof.

The nitrogen-containing compound portion of the salt thereof desirably includes di-aza compounds or tri-aza compounds.

Examples of the di-or tri-aza compounds include:

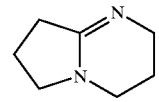

1,5-diazabicyclo[4.3.0]non-5-ene

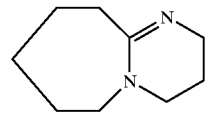

1,8-diazabicyclo[5.4.0]undec-7-ene ("DBU");
1,5,7-triazabicyclo[4.4.0]dec-5-ene; and

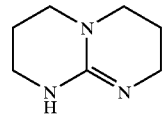

the bicyclo mono- and di-aza compounds:

quinuclidine; and

1,4-diazabicyclo[2.2.2.]octane.

Examples of the amine compounds include the following alkyl poly amines: diethylenetriamine, triethylenetetraamine, diethylaminopropylamine, isophoronediamine and menthenediamine; and the aromatic polyamines: m-xylenediamine, diaminodiphenylamine, and quinoxaline.

Examples of amide compounds include cyano-functionalized amides, such as dicyandiamide.

The imidazole compounds may be chosen from imidazole, isoimidazole, and substituted imidazoles—such as alkyl-substituted imidazoles (e.g., 2-methyl imidazole, 2-ethyl-4-methylimidazole, 2,4-dimethylimidazole, butylimidazole, 2-undecenylimidazole, 1-vinyl-2-methylimidazole, 2-n-heptadecylimidazole, 2-undecylimidazole, 2-heptadecylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms), and aryl-substituted imidazoles [e.g., phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4, 2-naphthyl-4,5-diphenylimidazole, 1-benzyl-2-methylimidazole, 2-p-methoxystyrylimidazole, and the like, generally where each aryl substituent contains up to about 10 carbon atoms and desirably up to about 8 carbon atoms].

Examples of commercial imidazole compounds are available from Air Products, Allentown, Pa. under the trade designation "CUREZOL" 1B2MZ, from Synthron, Inc., Morganton, N.C. under the trade designation "ACTIRON" NXJ-60 and from Borregaard Synthesis, Newburyport, Mass., under the trade designation "CURIMID" CN.

Of course, combinations of these amine compounds are also desirable for use in the compositions of the present invention.

The nitrogen-containing compound (depending on the relative basisity of the compound) is typically added to the composition as a salt with a weak or strong acid, thereby offering a spread of ion pair strength. For instance, a weak acid, such as a phenol, may form a salt with the nitrogen-containing compound. An example of this would be POLY-CAT SA-1, which is the phenolic salt of DBU, and is commercially available from Air Products, Allentown, Pa. Alternatively, a strong acid, such as p-toluenesulfonic acid, may form a salt with the nitrogen-containing compound. An example of this would be POLYCAT SA-102, which is the ethyl hexanoate salt of DBU, and is also commercially available from Air Products.

The pKa values of the acid used to form the salt with the nitrogen-containing compound should ordinarily be in the range of about 2.8 to about 10, with about 4 being particularly desirable, depending of course on the chosen nitrogen-containing compound. Examples of such acids include acetic acid, halogenated acetic acid, phenol, and aromatic sulfonic acids.

The pKb values of the nitrogen-containing compound should ordinarily be in the range of about 0.5 to about 9.5, with about 5 being desirable depending of course on the chosen acid compound. Examples of such nitrogen-containing compounds are set forth above. Of course, appropriate choices should be made for the nitrogen-containing compound and the acid so that pKa values and pKb values for the acid and the nitrogen-containing compound, respectively, are properly matched to form a salt having a disassociation potential appropriate to liberate the nitrogen-containing compound from the salt and the complex at a pre-determined temperature, such as the temperature at which solder melts.

In use, the salt of the nitrogen-containing compound and the acidic fluxing agent are contacted together to form a complex, thereby creating the latent curing agent component. The complex so formed should have a disassociation potential appropriate to allow for disassociation to occur in an epoxy-based matrix which is at least in part within the temperature range reached during the solder reflow cycle.

The latent curing agent component may be used in an amount of from about 0.3 to about 30 weight percent, based on the weight of the epoxy resin component, depending of course on the type and identity of the components which constitute the latent curing agent component.

Desirably, the nitrogen-containing compound should be used in the inventive compositions in an amount within the range of about 0.1 to about 1, such as about 0.5, thereby forming a latent curing agent having a nitrogen-containing compound portion of the complex in substantially the same amount.

Additives may be included in the inventive compositions, such as a reactive co-monomer component (e.g., a reactive diluent), defoaming agents (like those available commercially from BYK-Chemie, Wallingford, Conn. under the BYK trade name, such as BYK-515 or BYK-555), leveling agents, dyes, pigments, adhesion promoters, and the like.

Appropriate reactive diluents for use herein may include monofunctional or certain multifunctional epoxy resins. The reactive diluent should have a viscosity which is lower than that of the epoxy resin component. Ordinarily, the reactive diluent should have a viscosity less than about 250 cPs. In the event such a monofunctional epoxy resin is included as a reactive diluent, such resin should be employed in an amount of up to about 50 weight percent, based on weight of the epoxy resin component.

The monofunctional epoxy resin should have an epoxy group with an alkyl group of about 6 to about 28 carbon atoms, examples of which include $C_{6-28}$ alkyl glycidyl ethers, $C_{6-28}$ fatty acid glycidyl esters and $C_{6-28}$ alkylphenol glycidyl ethers.

Commercially available monofunctional epoxy resin reactive diluents include those from Pacific Epoxy Polymers, Richmond, Mich., under the trade designations PEP-6770 (glycidyl ester of neodecandoic acid), PEP-6740 (phenyl glycidyl ether) and PEP-6741 (butyl glycidyl ether).

Commercially available multifunctional epoxy resin reactive diluents include those from Pacific Epoxy Polymers, under the trade designations PEP-6752 (trimethylolpropane triglycidyl ether) and PEP-6760 (diglycidyl aniline).

That is the defoaming agent appears to provide beneficial effects on wetting the solder. The defoaming agent seems to reduce the surface tension on the solder, which is important in solder fluxing.

When used, the defoaming agent may be used in an amount up to about 1 weight percent, based on the total weight of the composition.

In addition, adhesion promoters, such as the silanes, glycidoxypropyl trimethoxysilane (commercially available from OSI under the trade designation A-187), gamma-amino propyl triethoxysilane (commercially available from OSI under the trade designation A-1100) or a trimethoxysilyl propylated isocyanurate (commercially available from OSI under the trade name SILQUEST, such as Y-11597), may be used.

When used, the adhesion promoters should be included in the inventive compositions in an amount up to about 2 weight percent.

The thermosetting resin compositions of the present invention may be of the one-pack type, in which all the ingredients are mixed together, or of the two-pack type in which the curable component(s), is(are) included in one part and the curing agent is stored separately in a second part, and mixed together only prior to use.

During a microelectronic application, the fluxing underfill compositions according to the present invention are ordinarily dispensed onto the circuit board, with or without a smoothing application, and a semiconductor chip or semiconductor device positioned thereover. More specifically, the inventive compositions are ordinarily applied to a circuit board having metallization pads. Solder is disposed over the composition coated-metallization pads. The semiconductor chip or semiconductor device is positioned over and mated with the circuit board and the solder reflowed. During the reflow step, the fluxing agent promotes adhesion of the solder to the metallization pads on the circuit board and the adhesive material is cured to mechanically interconnect and seal the underfilling between the circuit board and the semiconductor chip or semiconductor device.

The inventive compositions have been designed to cure at a certain time/temperature range combination within specified portions of the temperature portfolio reached during a solder reflow cycle that is observed during the solder reflow cycle. (See FIG. 2, curve B). For instance, the solder reflow profile for which the inventive compositions were designed is composed of several zones, where a temperature is reached or maintained for a set time period, or temperature increases occur over a set time period. These zones may be referred to as a pre-heating zone, a soak zone and a reflow zone.

In the pre-heating zone, the circuit board and semiconductor components are gradually heated to the soaking zone temperature. The heating gradation in the pre-heating zone may progress through the temperature range of about 30° C. to about 150° C. in a period of time of up to about 60 seconds.

In the soaking zone, the semiconductor components are allowed to thermally equilibrate so that the thermal expansions of the semiconductor components may occur and temperature adjustments can occur. The heating gradation in the soak zone may progress through the temperature range of about 150° C. to slightly greater than 180° C., such as about 183° C., from a period of time of about 60 to about 175 seconds from initiation. In the pre-heating and soaking zones, it is desirable for the underfill sealant to remain ungelled.

In the reflow zone, the solder flows and forms the electrical connection. The underfill sealant should gel after the solder has flowed and forms the electrical connection, otherwise the component present can shift, thereby causing an electrical disconnect. The heating gradation in the reflow zone may progress through the temperature range of slightly greater than 180° C., such as about 183° C., to about 220° C.+10° C., from a period of about 175 to about 205–265 seconds from initiation. See R. P. Prasad, *Surface Mount Technology: Principles and Practice*, Part Three— Manufacturing with Surface Mounting, International Thomson Publishing, New York, 578 (1997). It is desirable for the underfill sealant to cure completely after the solder has flowed to form the electrical connection.

As noted, the timing of this sequence is important because should the underfill sealant begin to gel before the solder has flowed, the gelled underfill sealant will impede the ability of the solder to flow and form electrical connections. Should this occur the microelectronic system is likely to fail, as the flow of solder aligns the semiconductor connections as well as forms the electrical connections. An underfill sealant that gels prior to the solder flowing is likely to inhibit the self alignment from occuring.

The zoned or staged solder reflow profile, described above, that was used as the target in the design of the inventive compositions is used extensively in the microelectronics industry. This profile is so widely used because it avoids thermally shocking the semiconductor components and the circuit boards, which would otherwise occur if the volcano profile were used (see FIG. 2, curve A).

Unlike previously developed fluxing underfill sealants, such as those described in U.S. Pat. No. 5,128,746, which begin to cure in the pre-heating zone of the solder reflow profile (depicted in FIG. 2, curve B), the inventive compositions maintain their physical properties in the uncured state through the pre-heating zone and the soak zone, and only cure at the temperature reached within the solder reflow zone.

The benefits of curing along this profile include allowing the formation of an electrical interconnection to occur, followed by curing of the underfill encapsulant, the ability to use the typical solder reflow profile without having to adjust that reflow profile to idiosyncrasies of the cure profile of the underfill encapsulant, and the ability of soaking the electronic components at a lower temperature without initial exposure to a spiked temperature, which may compromise their integrity.

The inventive compositions may be tailored within this cure profile by selecting the types and proportions of various components to reach a viscosity at a temperature of 25° C. in the range of 500 to 70,000 cps, such as 800 to 3,000 cps. At this viscosity, the gel times of the compositions will also be tailored to a specified period of time (such as 15 seconds, or 1 or 2 minutes) at a temperature of about 150° C. In such case, the inventive compositions should show no or substantially no increase of viscosity after a period of time of about ten minutes. With such a gel time, the compositions penetrate into the space (e.g., of 10 to 200 $\mu$m) between the circuit board and the semiconductor device relatively rapidly, and allow for a greater number of assemblies to be filled without observing a viscosity increase in the composition thereby rendering it less effective for application.

Reference to FIG. 1 shows a semiconductor device 4 having circuit board 1 with metallization pads 5 and 6 that have been coated using conventional dispensing techniques with a fluxing underfill adhesive composition 3 within the scope of this invention, and a semiconductor chip 2.

The fluxing underfill composition may be applied on either the carrier substrate or the semiconductor chip. One way to do this is with the stencil claimed and described in International Patent Publication No. PCT/FR95/00898.

A semiconductor chip 2 with solder bumps 7 and 8 is positioned over the circuit board 1 so that the solder bumps 7 and 8 of the semiconductor chip 2 face the circuit board 1 and are aligned grossly with the metallization pads 5 and 6. The semiconductor chip 2 is then contacted with the circuit board 1 so that the solder bumps 7 and 8 and the metallization pads 5 and 6 are contacted to form an assembly.

The assembly so formed is introduced to a zoned solder reflow oven, causing after the preheating and soak zones, the solder to flow thereby forming an electrical interconnection between the semiconductor chip 2 and the circuit board 1 once the reflow zone is reached. This allows for the solder bumps 7 and 8 of the semiconductor chip 2 to align finely with the circuit board 1.

Once the solder has flowed, the underfill composition cures without requiring a post cure to effect complete cure. During the solder reflow zone, therefore the semiconductor device is electrically interconnected by the solder and secured by the underfill.

The semiconductor chip ordinarily may be coated with a polyimide-, poly-benzocyclobutane- or silicone nitride-based material to passivate environmental corrosion.

The circuit board 1 may be constructed from ceramic substrates of $Al_2O_3$, $SiN_3$ and mullite ($Al_2O_3$—$SiO_2$); substrates or tapes of heat-resistant resins, such as polyimides; glass-reinforced epoxy; ABS and phenolic substrates which are also used commonly as circuit boards; and the like. Any electrical connection of the semiconductor chip to the carrier substrate may be used, such as connection by a high-melting solder or electrically (or anisotropically) conductive adhesive and the like. In order to facilitate connections, particularly in SBB technology, the electrodes may be formed as wire bond bumps.

Cured reaction products of the thermosetting resin compositions of the present invention demonstrate excellent adhesive force, heat resistance and electric properties, and acceptable mechanical properties, such as flex-cracking resistance, chemical resistance, moisture resistance and the like, for the applications for which they are used herein.

In the mounting process by using the thermosetting resin composition of the present invention, after the semiconductor device is mounted on the circuit board as described above, the resulting structure is tested with respect to characteristics of the semiconductor device, connection between the semiconductor device and the circuit board, other electrical characteristics, and the state of sealing.

The present invention will be more readily appreciated with reference to the examples which follow.

EXAMPLES

In these examples, compositions in accordance with the present invention were prepared and evaluated for performance.

Example 1

In these examples, we prepared epoxy-based adhesive compositions from the components noted below in their respective amounts as set forth in Table 1.

TABLE 1

| Component | | Sample No./Amt (wt %) | | | | | |
|---|---|---|---|---|---|---|---|
| Type | Identity | 1 | 2 | 3 | 4 | 5 | 6 |
| Epoxy | RE-310-S | 41.5 | 39.7 | 37.8 | 40 | 37.8 | 40 |
| | EPON1002f | 9.9 | 11.3 | 10.7 | 10 | 10.7 | 10 |
| Acidic fluxing agent | DIACID 1550 | 3.5 | 10.3 | 11.9 | 4 | 11.3 | 4 |
| | Salicylic acid | — | — | — | 3 | — | 3 |
| | Pimelic acid | — | — | — | — | 3.3 | — |
| | Adipic acid | 3.0 | — | — | — | — | — |
| | Glutaric acid | — | — | 2.7 | — | — | — |
| Anhydride | LINDRIDE 62C | 34.9 | 37.6 | 35.6 | — | — | — |
| | B 4400 | 6.3 | — | — | — | — | — |
| | MHHPA | — | — | — | 41.5 | 35.6 | 42.5 |
| Nitrogen-containing compound* | DBU | 0.3 | 0.3 | 0.3 | — | 0.3 | — |
| | POLYCAT SA-1 | — | — | — | 0.5 | — | — |
| | 2-ethyl-4-methyl imidazole | — | — | — | — | — | 0.5 |
| Adhesion promoter | A-187 | 0.5 | 0.7 | 0.9 | 1.0 | 0.9 | 1.0 |
| Defoamer | BYK-555 | 0.1 | 0.1 | 0.1 | — | 0.1 | — |
| | BYK-515 | — | — | — | 0.1 | — | 0.1 |

*In Samples Nos. 1–3, the nitrogen-containing compound was contacted with the acid fluxing agent to form a complex before any other components were added to the mixture.

These samples were prepared by charging into a reactor the EPON 1002f, RE-310-S and the chosen acidic fluxing agent. The mixture was then heated under a nitrogen atmosphere to a temperature of about 150° C. with stirring until a solution was achieved. The mixture was then cooled to a temperature of about 50° C., to form a Part A epoxy premix. In a separate reactor, the nitrogen-containing compound and the DIACID 1550 were mixed at a temperature of about 100° C. under a nitrogen atmosphere, and then cooled to room temperature, to form a Part B accelerator premix.

Then, a reactor was charged with the anhydride and the Part A epoxy premix. This mixture was then mixed rapidly under vacuum at a temperature of about 25° C. for a period of about 90 minutes, after which time the adhesion promoter and the Part B accelerator premix were added. This mixture was then stirred under a vacuum with cooling for a period of time of about 30 minutes, after which time the vacuum was released and the mixer purged with nitrogen.

Sample Nos. 1–5 are within the scope of the present invention, whereas Sample No. 6 is not, as it does not include a salt of a nitrogen containing compound. Rather, Sample No. 6 includes an imidazole without an acid salt.

Figure 2:
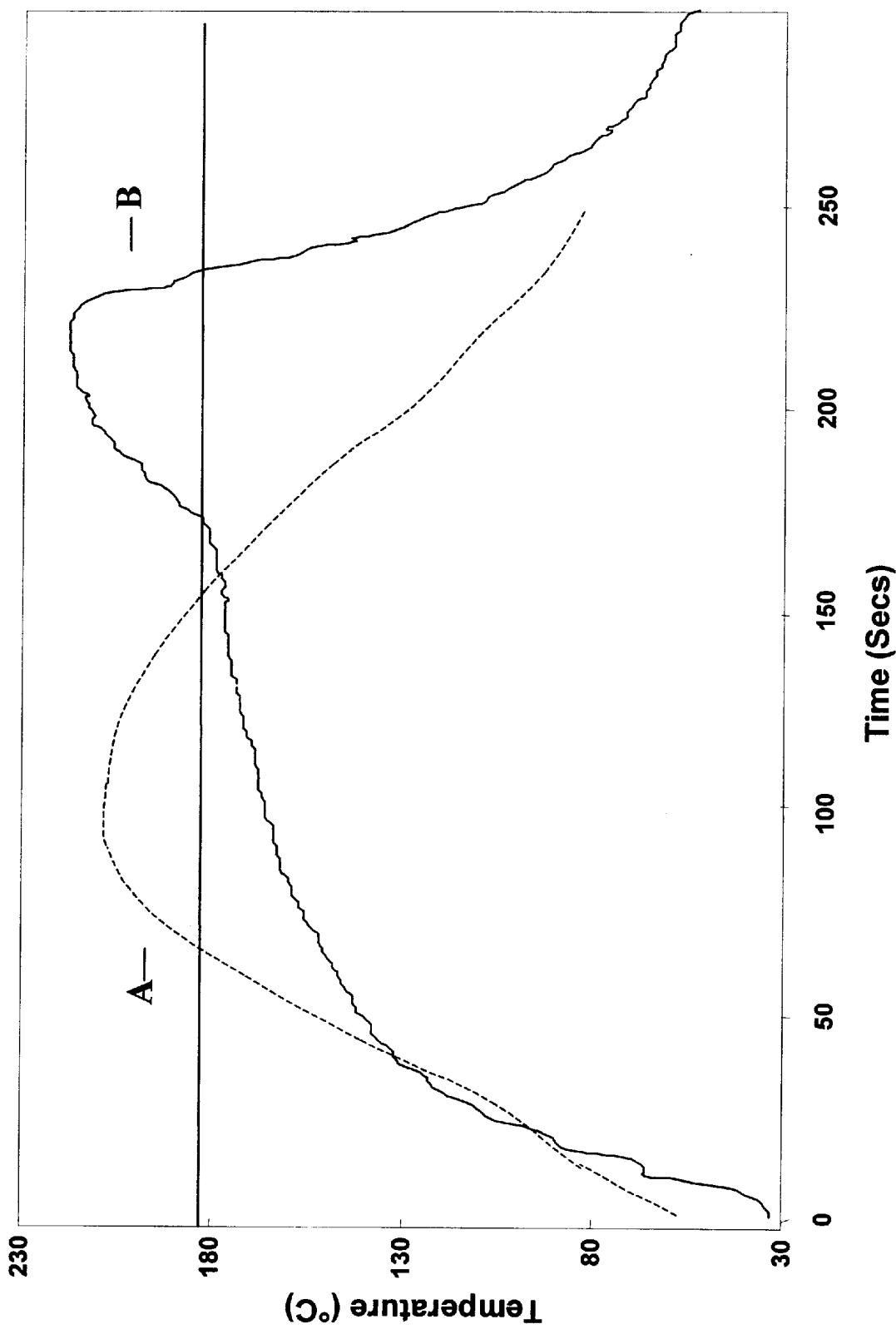
FIG. 2 depicts a plot of temperature (° C.) versus time (seconds) of a typical solder reflow cycle ("curve B"), and of a solder reflow cycle, where the temperature has been spiked (the "volcano profile", "curve A") which is typical for the known fluxing underfill materials, such as those described in the '746 patent.

Sample Nos. 1–3 were used to connect and underfill ten 4×4 PB8 die to a test circuit board and reflowed using a profile comparable to FIG. 2, curve B. All of these die demonstrated electrical conductivity. Sample Nos. 4–6 were used to connect and underfill four FB 250 die to a test circuit board and reflowed using a profile comparable to FIG. 2, curve B. All four die demonstrated electrical conduction with Sample Nos. 4 and 5, whereas none of the four die demonstrated electrical conductivity with Sample No. 6.

Example 2

Example 4 from U.S. Pat. No. 5,128,746 was replicated to demonstrate the benefits and advantages of the present invention.

The formulation of that example (Sample No. 7), together with a formulation in accordance with the present invention (Sample No. 8), are presented below in Table 2.

TABLE 2

| Component | | Sample No./(Amt wt %) | |
|---|---|---|---|
| Type | Identity | 7 | 8 |
| Epoxy | RE-310-S | 50 | 50 |
| Acidic fluxing agent | Salicylic acid | 7 | 7 |
| Anhydride | MHHPA | 42.5 | 42.5 |
| Latent curing agent | 2-ethyl-4-methyl imidazole | 0.5 | — |
| | POLYCAT SA-1 | — | 0.5 |

While Example 4 of the '746 patent uses EPON 828 as the epoxy resin and malic acid as the acidic fluxing agent for each of the formulations, the comparison used RE-310-S as the epoxy resin, which too is a bisphenol A epoxy resin, and salicylic acid as the acidic fluxing agent.

The difference in the formulation resides in the latent curing agent—the comparative formulation, Sample No. 7, used an imidazole, at 0.5 weight percent, whereas the inventive formulation, Sample No. 8, used POLYCAT SA-1, a DBU-phenol salt, also at 0.5 weight percent. Though the amount of the latent curative is half of that used in the '746 patent, a lower amount of the latent curative would retard cure, all else being equal, which should enhance the fluxing capability of the formulation. Thus, if any difference in performance was to be recognized, the differences would be expected to be an improvement. Instead, when Sample Nos. 7 and 8 were used to connect and underfill FB 250 die to a test circuit board and reflowed using a profile comparable to FIG. 2, curve B, the die connected and underfilled using Sample No. 7 failed to demonstrate electrical conductivity, whereas the die connected and underfilled using Sample No. 8 demonstrated electrical conductivity.

Example 3

In this example, we compared the curing behavior of known fluxing underfill materials, such as those described in the '746 patent, with a fluxing underfill material in accordance with the present invention, when cured using a typical solder reflow profile, such as is shown in FIG. 2, curve B. More specifically, differential scanning calorimetry was performed on these materials, formulations for which are set forth below in Table 3, in a power compensation mode, so as to measure the power required to compensate for temperature differences between each material and a control. These samples included an inorganic filler component to thicken the formulations.

TABLE 3

| Component | | Sample No./ (Amt wt %) | |
|---|---|---|---|
| Type | Identity | 9 | 10 |
| Epoxy | RE-310-S | 40 | 40 |
| Acidic fluxing agent | Salicylic acid | 5.6 | 5.6 |
| Anhydride | MHHPA | 34 | 34 |
| Latent curing agent | 2-ethyl-4-methyl imidazole | 0.4 | — |
| | POLYCAT SA-1 | — | 0.4 |
| Inorganic filler | SO-E5 | 19.2 | 19.2 |
| | AEROSIL R812S | 0.8 | 0.8 |

Figure 3A:
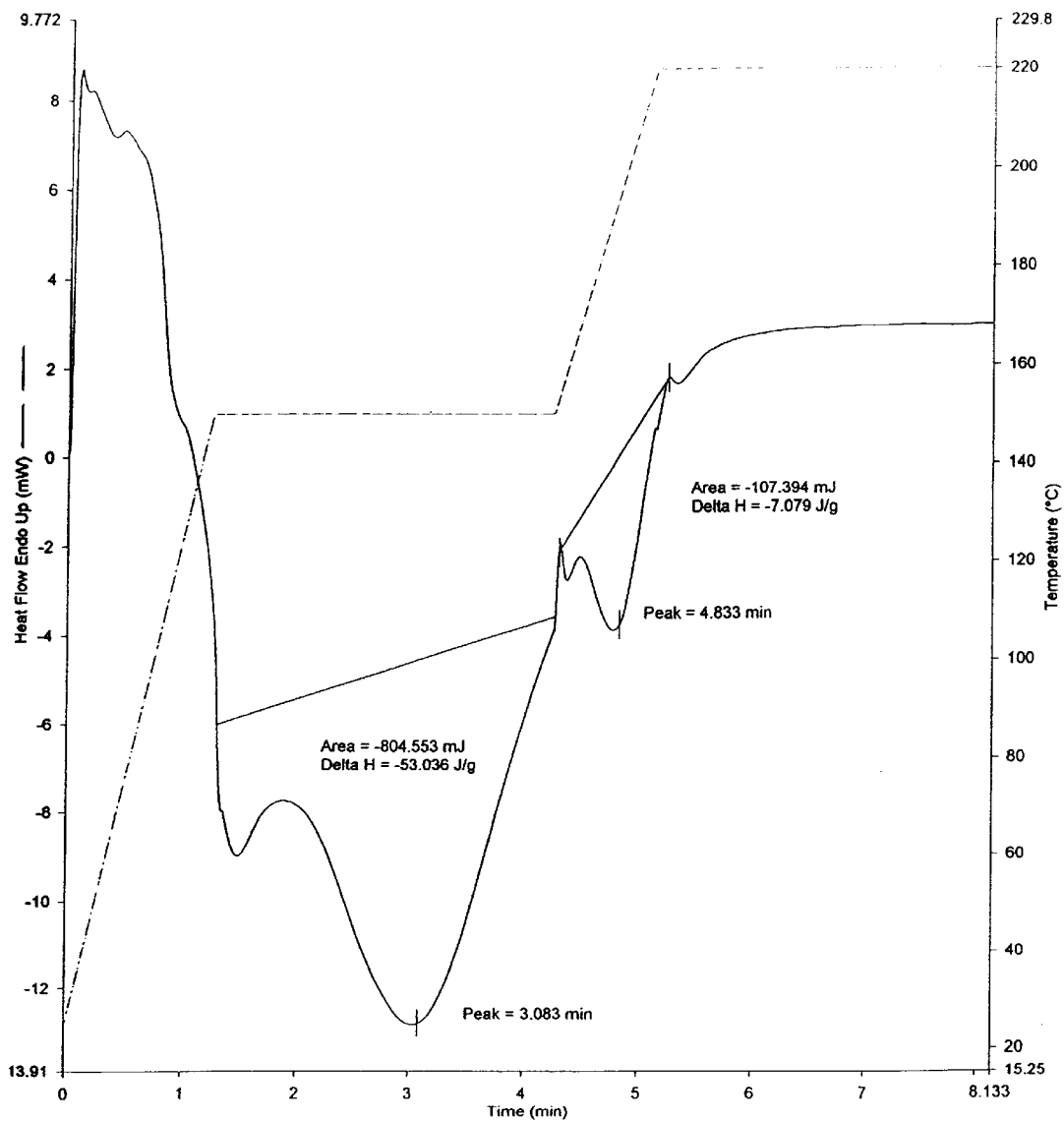
FIGS. 3A and 3B depict differential scanning calorimetry curves for the known fluxing underfill materials, such as those described in the '746 patent, as contrasted with a fluxing underfill material in accordance with the present invention, conducted in a power compensation mode, so as to measure the power required to compensate for temperature differences between the sample and a control.

Sample Nos. 9 and 10 were disposed within an aluminum DSC pan, and heated according to the solder reflow profile like that depicted in FIG. 2, curve B. Reference to FIG. 3A shows that Sample No. 9 begins to cure at a temperature of about 140° C.—during the pre-heating zone. FIG. 3A indicates that Sample No. 9 has cured during the soak zone.

Figure 3B:
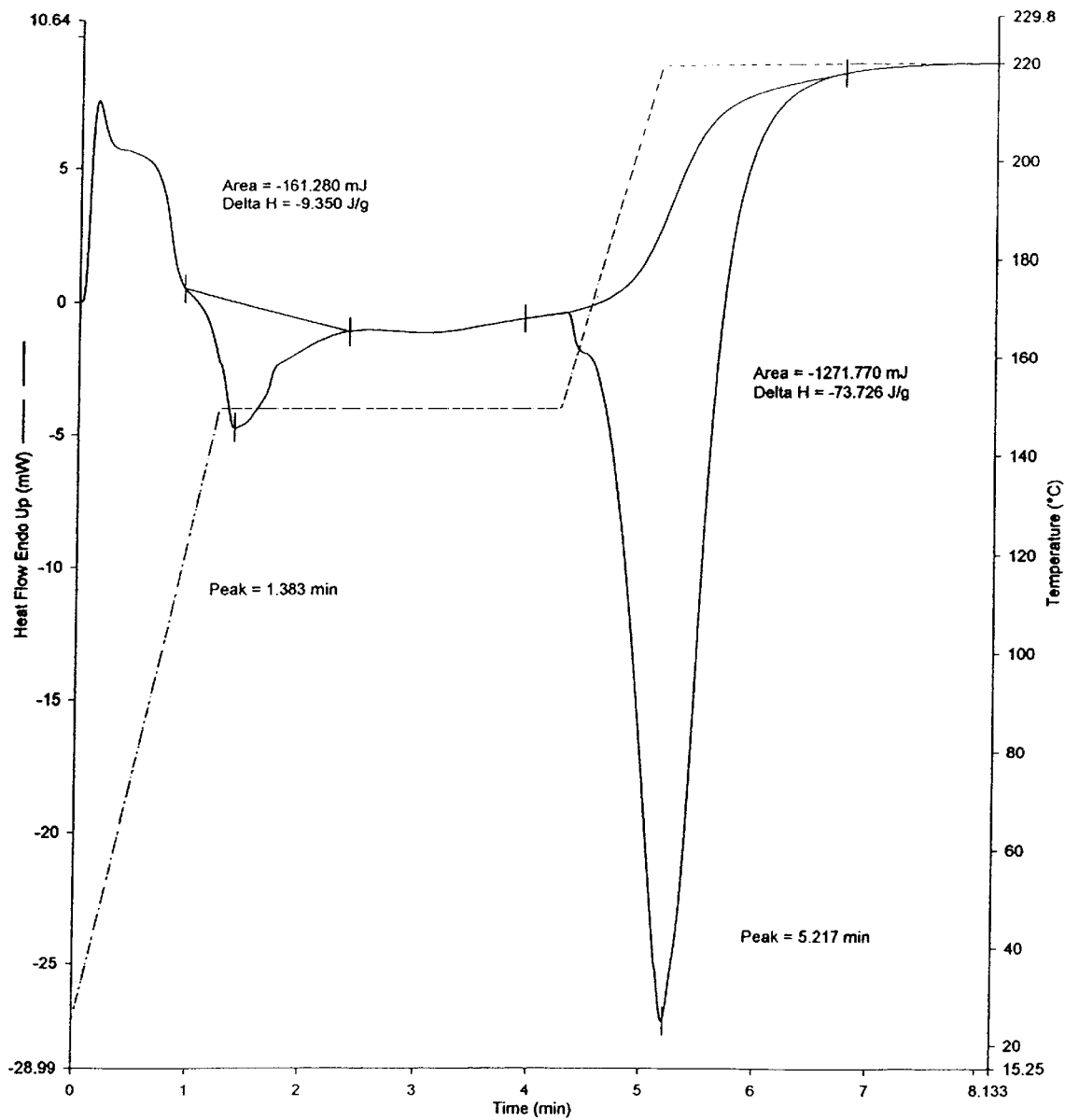

In contrast, reference to FIG. 3B shows that Sample No. 10 remains in an uncured state (the curve is substantially flat) until reaching the reflow zone, at which point the onset of cure is observed at about 160° C. with cure completing at the solder reflow temperature of about 220° C.

That which is described above is presented as illustrative, rather than limiting, of the inventive compositions. Many additional embodiments thereof are included in the spirit and scope of the invention, which are defined by the claims.

What is claimed is:

1. A fluxing underfill composition, comprising:
   (a) an epoxy resin component;
   (b) an acidic fluxing agent component;
   (c) an anhydride component; and
   (d) a latent curing agent component comprising a complex of a portion of the acidic fluxing agent and a salt of a nitrogen-containing component.

2. The composition according to claim 1, wherein the anhydride compounds may be selected from the group consisting of hexahydrophthalic anhydride, methyl hexahydrophthalic anhydride, 5-(2,5-dioxotetrahydrol)-3-methyl-3-cyclohexene-1,2-dicarboxylic anhydride, and combinations thereof.

3. The composition according to claim 1, wherein the nitrogen-containing component is a member selected from the group consisting of amine compounds, amide compounds, imidazole compounds, and combinations thereof.

4. The composition according to claim 1, wherein the amine compounds of the curing agent component may be selected from the group consisting of 1,5-diazabicyclo[3.4.0]non-5-ene, 1,8-diazabicyclo[5.4.0]undec-7-ene, 1,5,7-triazabicyclo[4.4.0]dec-5-ene, quinuclidine, 1,4-diazabicyclo[2.2.2]octane, diethylenetriamine, triethylenetetramine, diethylaminopropylamine, m-xylenediamine, diaminodiphenylamine, isophoronediamine, menthenediamine, quinoxaline, and combinations thereof.

5. The composition according to claim 1, wherein the amide compound is dicyandiamide.

6. The composition according to claim 1, wherein the imidazole compounds may be selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-methyl imidazole, 2-undecenylimidazole, 1-vinyl-2-methylimidazole, 2-n-heptadecylimidazole, 2-undecylimidazole, 2-heptadecylimidazole, 2-ethyl 4-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and trimellitic acid, 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4, 2-naphthyl-4,5-diphenylimidazole, 1-benzyl-2-methylimidazole, 2-p-methoxystyrylimidazole, and combinations thereof.

7. The composition according to claim 1, wherein the nitrogen-containing compound is in the form of a salt with an acid.

8. The composition according to claim 7, wherein the acid is a strong acid.

9. The composition according to claim 7, wherein the acid is a weak acid.

10. The composition according to claim 3, wherein the acid has a pKa value within the range of about 2.8 to about 10.

11. The composition according to claim 7, wherein the nitrogen-containing compound has a pKb value within the range of about 0.5 to about 9.5.

12. The composition according to claim 7, wherein the acid is a member selected from the group consisting of acetic acid, halogenated acetic acids, phenols, aromatic sulfonic acids and combinations thereof.

13. The composition according to claim 1, further comprising an adhesion promoter.

14. The composition according to claim 13, wherein the adhesion promoter is a member selected from the group consisting of glycidoxypropyl trimethoxysilane, gamma-amino propyl triethoxysilane, and combinations thereof.

15. The composition according to claim 1, wherein cured reaction products thereof are capable of sealing the space between a semiconductor device including a semiconductor chip mounted on a carrier substrate and a circuit board to which said semiconductor device is electrically interconnected or a semiconductor chip and a circuit board to which said semiconductor chip is electrically interconnected, while providing electrical conduction between the semiconductor chip and circuit board or semiconductor device and circuit board.

16. The composition according to claim 11, capable of curing during a solder reflow cycle and allowing for electrical conductivity between the semiconductor device and the circuit board or the semiconductor chip and the circuit board.

17. The composition according to claim 1, capable of curing (a) after exposure to the following time/temperature profile: up to about 60 seconds at about 30° C. to about 150° C., about 60 seconds to about 175 seconds at about 150° C. to slightly greater than 180° C., and (b) during exposure to a time/temperature profile of about 175 seconds to about 205–265 seconds at slightly greater than 180° C. to about 220° C.±10° C.

18. Reaction products formed from the compositions according to claim 1.

19. An electronic device comprising a semiconductor device and a circuit board to which said semiconductor device is electrically connected or a semiconductor chip and a circuit board to which said semiconductor chip is electrically connected, assembled using a fluxing underfill composition according to claim 1 to flux the electrical interconnection and seal the space between the semiconductor device and the circuit board or the semiconductor chip and the circuit board, respectively.

20. The electronic device according to claim 19, wherein when cured to reaction products the device demonstrates electrical conductivity.

21. A method of assembling an electronic device by fluxing electrical interconnections and sealing underfilling between a semiconductor device including a semiconductor chip mounted on a carrier substrate and a circuit board to which said semiconductor device is electrically interconnected or a semiconductor chip and a circuit board to which said semiconductor chip is electrically interconnected, the steps of which comprise:

(a) dispensing into the underfilling between the semiconductor device and the circuit board or the semiconductor chip and the circuit board a composition according to claim 1; and (b) exposing the composition as so dispensed to conditions appropriate to cause the composition to cure into reaction products, wherein when cured to the reaction product the electronic device demonstrates electrical conductivity.

\* \* \* \* \*